United States Patent [19]

Lacan et al.

[11] 4,039,902

[45] Aug. 2, 1977

[54] ELECTRONIC AUTOMATION SYSTEM

[75] Inventors: Guy Lacan, Carrieres sur Seine; André Vergez, Villennes sur Seine, both of France

[73] Assignee: La Telemecanique Electrique, France

[21] Appl. No.: 455,490

[22] Filed: Mar. 27, 1974

[30] Foreign Application Priority Data

Mar. 29, 1973 France .................. 73.11413

[51] Int. Cl.² .............................................. A05K 1/04
[52] U.S. Cl. .................................. 361/395; 361/394; 361/399; 361/400
[58] Field of Search ............... 317/118, 120, 101 CC, 317/101 D, 101 CM; 174/59; 339/276 A; 29/203 MW

[56] References Cited

U.S. PATENT DOCUMENTS

| | | | |
|---|---|---|---|
| 2,412,259 | 12/1946 | Graves, Jr. .................. | 174/59 |
| 2,936,407 | 5/1960 | Ewazo ...................... | 317/101 CE |
| 3,088,087 | 4/1963 | Colten ....................... | 339/226 A |
| 3,197,766 | 7/1965 | Stein et al. ................ | 317/101 D |
| 3,300,686 | 1/1967 | Johnson et al. ............ | 317/101 DH |
| 3,349,292 | 10/1967 | Meacham .................. | 317/120 |
| 3,518,611 | 6/1970 | Shores, Jr. ................. | 317/99 |
| 3,740,697 | 6/1973 | Van Son .................... | 339/276 A |
| 3,891,898 | 6/1975 | Danion ...................... | 317/101 CC |

*Primary Examiner*—David Smith, Jr.
*Attorney, Agent, or Firm*—William Anthony Drucker

[57] ABSTRACT

This invention relates to a system for interconnecting pluggable logic modules, for example in industrial automation or process control systems. The modules incorporate flexible connecting members which enable them to be plugged directly onto the ends of a series of parallel metal pins which are arranged in a regular pattern on one or more insulating supports, the pins having conductive portions intermediate their ends which are accessible from the side of the supports to which the modules are plugged, the said conductive portions of the pins being standardized so as to allow conductors which interconnect the modules to be readily attached to said sections.

8 Claims, 10 Drawing Figures a b c

ELECTRONIC AUTOMATION SYSTEM

The invention relates to an electrical and electronic automation system in which plug-in modules intended to carry out logic operations or functions are connected to one another, and also to ancillary devices which, on the one hand, allow instructions or input and output variables to be fed in, and, on the other hand, allow control signals to be supplied or output variables to be generated.

By "input variables" is meant both signals originating from apparatus to be controlled, such as, for example, those supplied by sensors or detectors, and also instructions given by an operator by means of ancillary control or setting equipment, such as press-buttons, digital selectors, etc, while "output variables" include both signals for displaying a condition, for example for illuminated display, and also instructions intended to govern the apparatus to be controlled.

Such a system may be applied, for example, to the cabinets or racks in which circuitry intended for automatic process control or for sequential control of industrial plant is grouped.

Many systems intended to carry out the above-mentioned tasks are known.

In one of these systems, which is described in German Auslegeschrift No. 1,765,800, cabinets are used in which are arranged a plurality of drawers or, to define them more broadly removable sub-units each of which contains printed-circuit boards carrying electronic components intended to carry out specific functions.

These boards are connected to, or plugged into, connectors, the rear faces of the connectors cooperating with the ends of pins which pass through a wall, the other ends of the pins being arranged to take the bared ends of interconnecting conductors which are connected thereto by automatic or semi-automatic processes, such as wrapping, termi-point, etc.

In another known system, described in French Pat. No. 1,344,202 filed on Jan. 18, 1962 by the present Applicants, the circuits intended to perform the logic functions are in modular form and use plug-in housings. The said housings, in turn, may contain one or more printed circuits. The housings are connected together by means of strips associated with the printed circuits, and conductors, the ends of which are provided with connecting members such as the terminals known as "Faston" terminals. The principle of connection itself calls for the connecting members to be placed in position solely by manual means and requires a certain amount of lateral access to be available.

Of these known systems, the first-mentioned is not arranged in such a way as to make clear the way in which the electrical or electronic circuits intended for controlling a plant are laid out, with the result that fitting and maintenance are not made any easier, even if the responsible engineer is familiar with the circuit diagrams as he may and should be. Furthermore, any alteration to, or check on, the wiring makes it necessary to have access to the rear of the wall.

In the second-mentioned system, although its actual physical lay-out may be largely based on the flow-chart for controlling the plant when the layout of the logic modules is designed, and trouble-shooting and maintenance may be made easy in this way, it is, on the other hand not possible to automate the connecting process, with the result that the cost of this type of installation rises with the number of functions employed. Furthermore, the difficulty of connecting a number of interconnecting conductors to a single point is increased by the type of terminal employed. Finally, the strips are rather fragile.

In both of the systems described above, the connections between the logic unit and the input and output variables are made via conductors which rely on different techniques from those used for the said logic unit.

Thus, terminal blocks are generally used to connect the logic unit just mentioned to the power supply or mains and to conductors which convey input signals. Of these signals, those which are generated by the operator, for example by means of press buttons or the like, use conductors, the ends of which are matched to releasable screw-clamped connecting members connected to the press-button, which is itself often arranged on the door of the cabinet containing the system.

The same applies to display members such as indicators, or to setting members such as digital switches.

The result of using these different techniques is, on the one hand, high manufacturing costs and on the other hand, the creation of too large a spares store.

Furthermore, the use of different connecting or interconnecting techniques introduces different levels of reliability, with the result that it is difficult to establish the probability of satisfactory operation over a given length of time.

Finally, the use of printed circuits to form logic modules calls for slide-out racks to be used and these are very expensive to produce and become less and less justified as the reduction in power consumption due to the introduction of integrated circuits give rise to a reduction in the need to dissipate heat.

The invention therefore proposes to provide an automation system in which the active components such as those which make up the logic unit and the control and setting ancillaries, as well as the passive components such as those which are used for display, are in a removable modular form which allows their function to be easily recognised, but which employ only a single method of connection, and still permits access to practically all the interconnections and internal connections from a direction which is the same as that in which modules containing active or passive components are fitted.

In accordance with the invention, this result is achieved due to the fact that the logic circuits and ancillary apparatus are in the form of modules and incorporate flexible connecting members which enable them to be plugged directly on to the ends of a series of parallel metal pins which are arranged in a regular pattern on one or more insulating supports, the said pins having at least one conductive section which is accessible from the side at which the modules are plugged in, and which is standardised to enable interconnecting conductors to be fitted.

According to a further feature, by means of which bulk can be reduced, and the speed at which the pins are wired-up can be increased, the cross-section and spacing of the pins is such that the ends of the interconnecting conductors can be fitted to the sections of the pins which are close to the supports by mechanised means.

Subsequent measures may be taken to ensure that the modules are regularly arranged, to prevent impairment of the satisfactory nature of the connection between the pins of the conductors, and to improve the firmness with which the interconnected modules are held in place. These measures may consist in providing each module with means which cooperate with a member secured to the support or chassis in such a way that the distance between the module and the insulating support is greater than the length of the parts of the pins used for interconnecting purposes.

Other significant features, relating mainly to the interconnecting of insulating supports situated in different planes or directions, will become more clearly apparent from the following description and accompanying drawings, in which.

Figure 10:
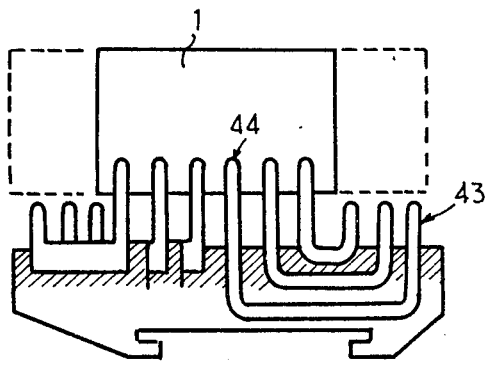
Figure 9:
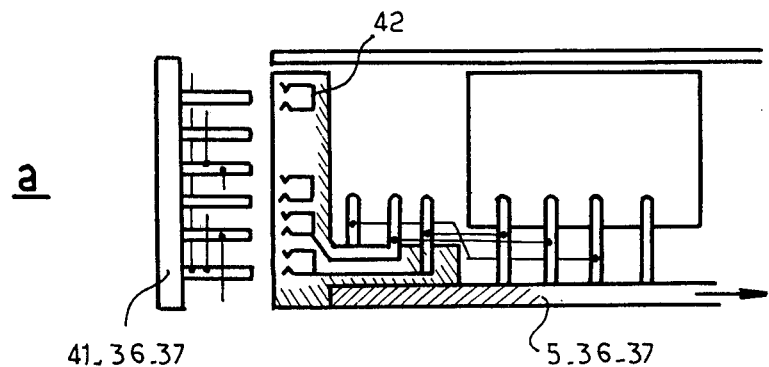
Figure 9:
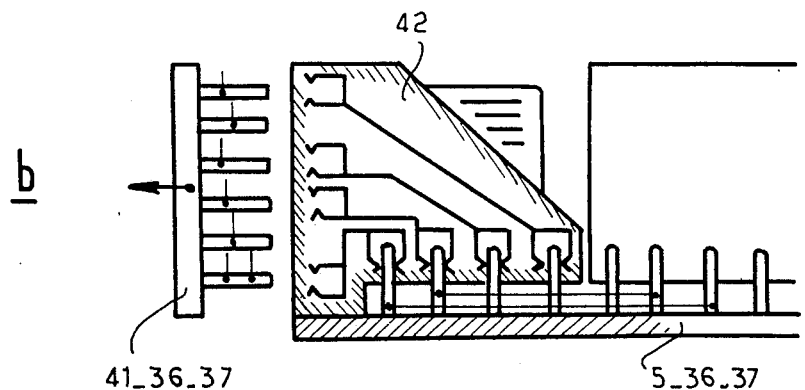
Figure 9:
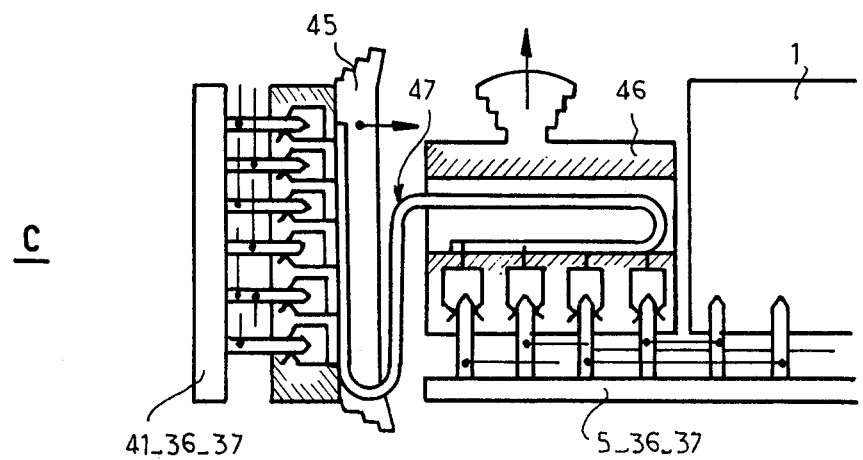

FIGS. 9a, 9b, and 9c show connecting strips and connectors which enable groups of supports to be interconnected;

FIG. 10 shows a modification of the module supports.

Figure 1:
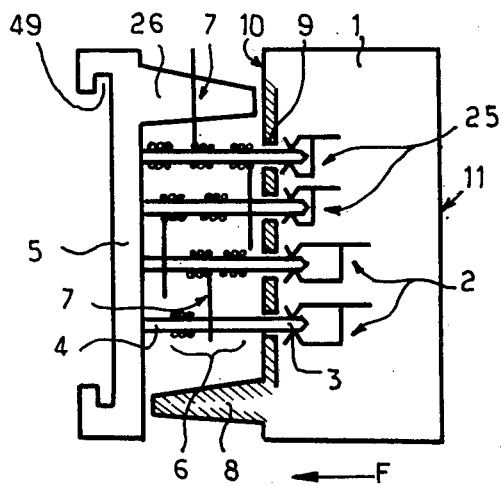
FIG. 1 is a plan view of part of the system according to the invention.

In FIG. 1, 1 is an automation module which may be either an active component, that is to say one intended to perform a logic operation, for example by means of electronic circuits, or to carry out switching operations either by means of an internal relay or when caused to do so by a manual control, or a passive component such as a stabilised power supply, a signal indicatior or display, a component which merely comprises a dial-equipped measuring device, or simply a member which brings together conductors for the purpose of measuring potentials or transmitting signals derived from them.

In one face 10, this module 1 has a series of openings 9 situated opposite internal flexible connecting members 2 or 25 which may be formed by flexible clips which are made of a suitable metal and which are known per se. These connecting members are connected internally to circuits (not shown) in the module. An insulating support 5 has a series of mutually parallel metal pins 4, with the spacing between the pins corresponding to that between the openings 9 in the module. The support in question may incorporate attachment means 49 which enable it to be hooked onto a standard shaped member 18 (see FIG. 2).

These pins, which are anchored into the insulating support by moulding, crimping, or any other means, each comprise a first section 3 at its free end, and a second section 6 situated between the support and the first section 3.

The first section 3 is intended to be inserted in an associated opening 9 and to fit into the associated flexible connecting members 2 and 25 in the module, while the second section 6 is intended to accommodate the ends of conductors, such as conductors 7 which, are used to connect the modules to each other or to a power supply or sources, input variables, or output variables, using semi or completely automatic methods of connection, or manual methods of connection, which may consist in winding the ends of the conductors onto the sections 6.

Consequently, if the insulating support 5 is arranged against a wall by means of members 18, the module 1 is fitted in the direction indicated by arrow F, this direction being the same as that in which the interconnecting conductors 7 are fitted.

This being so, the two main components of the system, namely the conductors and the modules, are completely accessible for fitting, checking or alteration purposes, while their arrangement relative to one another is preferably arranged so as to correspond to the way in which the chain of control is organised.

Figure 2:
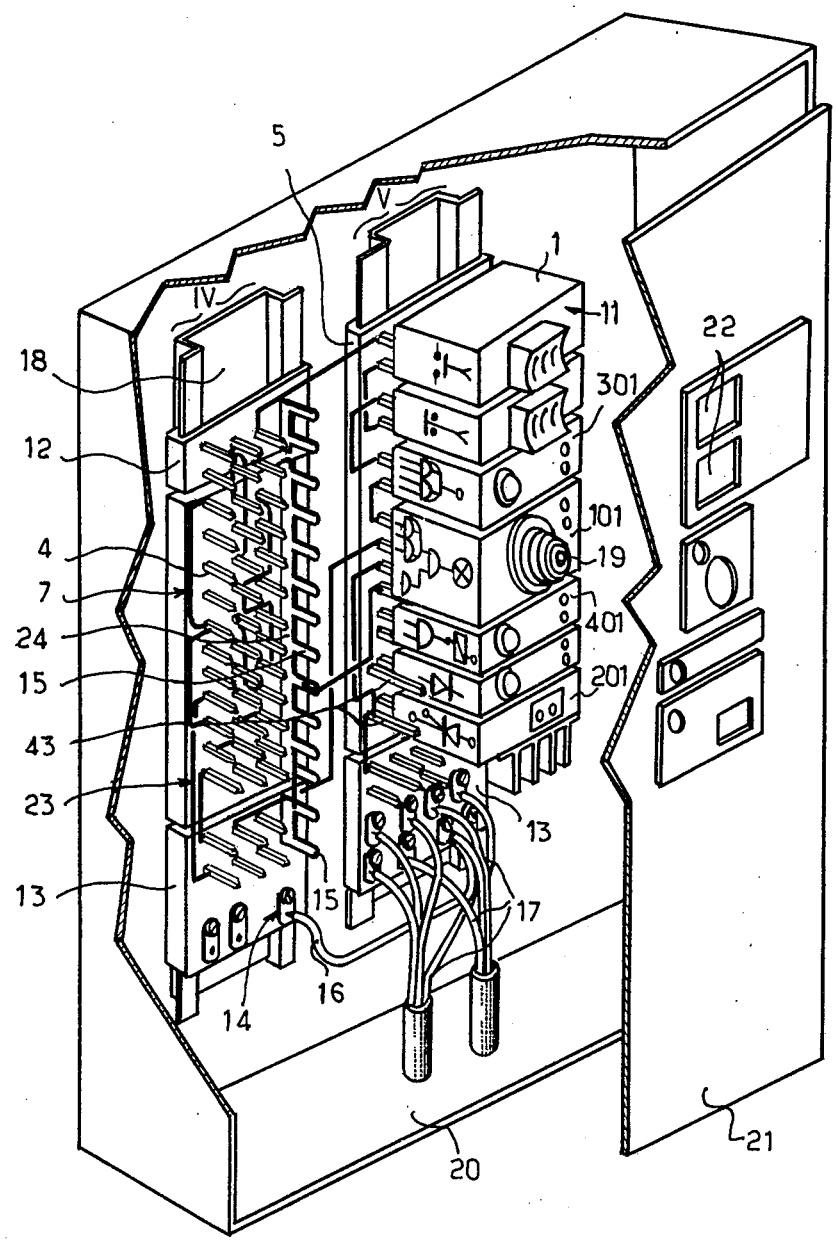
FIG. 2 shows an embodiment which employs a variety of passive and active modules.

In FIG. 2 is shown an embodiment from which it can be seen how different modules which are intended to perform various functions may be connected to each other or to sources and inputs and outputs. Furthermore, the dimensions of these modules are such that, once they are fitted, their front walls or faces 11 furthest from the supports 5 and 12 lie approximately in the same plans so that those of the surfaces on which some action is exerted, or which need to be observed are accessible or visible through openings 22 in a wall 21 which closes the cabinet 20 containing the system, this wall being situated close to the faces 11.

In this embodiment of the invention, the cross-sectional and isolating characteristics of the ends of those conductors 16, 17 which originate externally of the cabinet 20 are those normally dictated by safely considerations and are therefore not usually compatible with their being connected to the pins by winding, unlike the conductors 7.

It is for this reason that intermediate insulating connecting members such as the blocks or members 13 are used. These members have pins comparable to the pins 4 which are connected to terminals 14, for example by clamping screws.

The insulating supports and the connecting members may be secured in the cabinet by any means ensuring that the rows and columns of pins fall into line with the object either of making it easier to identify them when connection is performed manually, or of making it possible to use an automatic wiring machine which is intended to attach the interconnecting conductors 7 by using known methods such as wire wrapping or termipoint. To this end, the supports 5, 12 or 13 may be arranged on standard size Ω shaped runners such as the members 18.

By way of non-limiting example, FIG. 2 shows control modules such as a press-button module 1, a logic module 301, a module 101 which combines a logic circuit and a display device (19, a module 401 which contains logic circuitry and a relay, and a power module 201 which contains a controlled semi-conductor.

The interconnecting conductors 7 and the conductors 23 intended to connect the pins 4 in the supports 12 to connecting member 13 may be arranged either to provide connection paths within the same group IV of aligned modules, or to convey information from one group IV to another group V.

The insulating supports 5 may be of any suitable length, or may be of a modular form similar to the support 12. The supports may also have pins 15 which are cut from a single strip 24 anchored in the supports so as to allow the transverse of signals or supply of voltages common to certain modules, without the necessity for additional connections.

It is also possible to fix all the pins to a single insulating support of suitable size so that wiring can be performed automatically before assembly. If it is desired to employ standard wiring machines it is necessary to use pins having a standard cross-section, such as a square cross-section having 1 mm. sides.

This results in the length of the pins becoming great in relation to their cross-section, and certain dangers may thus arise when the modules are fitted.

One danger is that the pins may be bent, another danger is that undesired contact may occur between the faces 10 of the modules and the ends of the interconnecting conductors, and there is also the risk that the modules may be displaced from the pins if impact or vibration should subsequently occur.

To limit the distance by which the modules can travel above the pins, it is possible to cause the first sections or ends 3 of the pins to abut a fixed part of the modules for example to abut the bases of the flexible connecting member such as 25 (see FIG. 1), or to provide the modules with projections such as studs 8 which will rest against the supports 5, or, additionally or alternatively, to provide the supports 5 with projections such as pegs 26.

Figure 3:
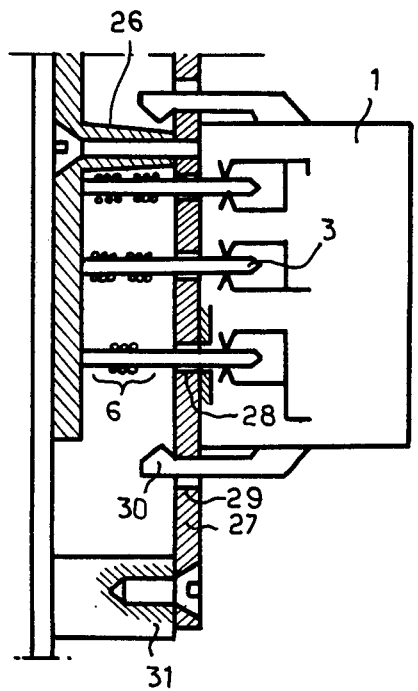
FIGS. 3 and 5 illustrate embodiments intended to protect the wiring, and to hold the modules firmly in place.

In another embodiment, illustrated in FIG. 3, which enables the dangers mentioned above to be reduced, an insulating protective plate 27 provided with openings 28 is arranged between the second sections 6 of the pins which are intended to be employed for the interconnections, and the first sections or ends 3 of the pins onto which the modules are intended to fit.

In addition to the openings 28 through which the pins are intended to pass, the protective plate 27 may also contain other openings, such as 29, which are intended to cooperate with flexible locking members 30 which are carried by a module 1 to prevent it becoming unintentionally unplugged.

This protective plate, which may be fixed either to the pegs 26 integral with the supports or to members 31 secured to the chassis, also improves the appearance of the system and prevents the ingress of foreign bodies between the sections of the pins masked by the plate.

In modifications, which are obvious to the man skilled in the art, the modules could be secured to the protective plate by known means such as ascrews, clamps and springs.

Markings may also be provided on the surface of the protective plates 27 at suitable points to serve as a reminder as to which type of module should be used.

Figure 5:
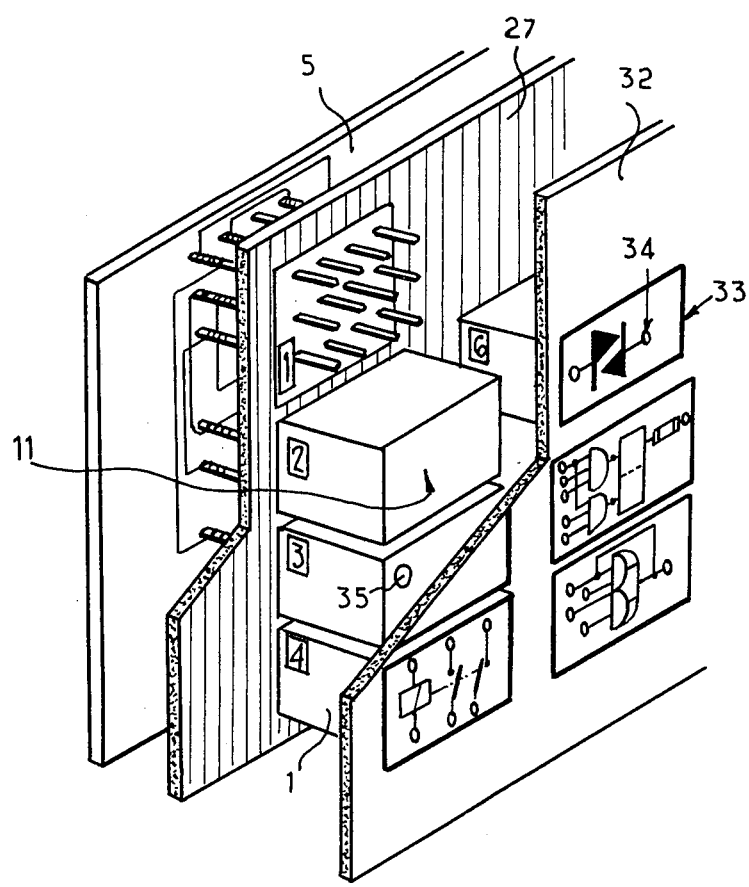

In FIG. 5 no locking members are used to hold the modules captive on the protective plate, but instead a cover plate 32 attached to a fixed portion of the housing or cabinet containing the system is arranged in close proximity to the front walls 11 of the modules (which walls, as described above, preferably all lie in a common plane).

The plate 32 may be a transparent electrically insulating plate, and may bear markings 33 relating to the functions of the modules which it covers. The plate may have openings 34 pierced or otherwise formed in it which provide access to test terminals situated opposite the openings on the modules, in a way known from Applicants' French Pat. No. 1,344,202.

Figure 4:
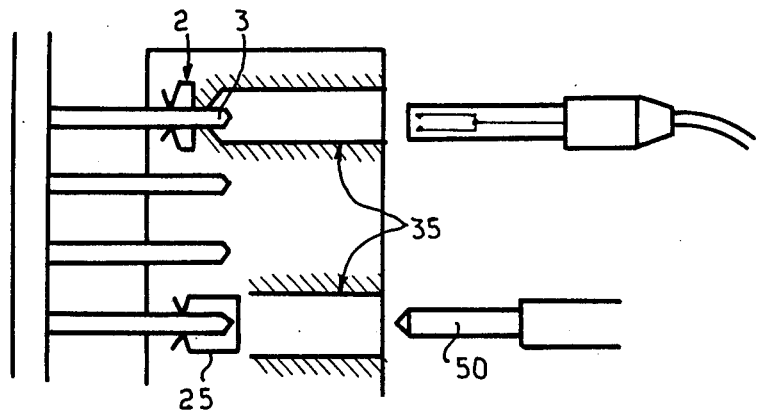
FIG. 4 shows means intended to enable control members to be fitted.

As can be seen from FIG. 4, the test terminals preferably comprise the ends 3 of certain of the pins, access to which is provided, for example, by passages 35. This embodiment of test terminals is, however, not limiting, and direct contact between a testing member 50 and the connecting members 2 may be envisaged.

When the number of groups of modules arranged in parallel rows is large (see FIG. 6), the interconnecting conductors may build up on top of one another along the pins to form layers of excessive depth. In this case, it may be preferable to make certain interconnections (such as those for power supply sources and/or input and output signals) by means of collector strips 36, similar to the supports 5, which arranged at right angles to the groups of modules along their ends of the latter.

Figure 6:
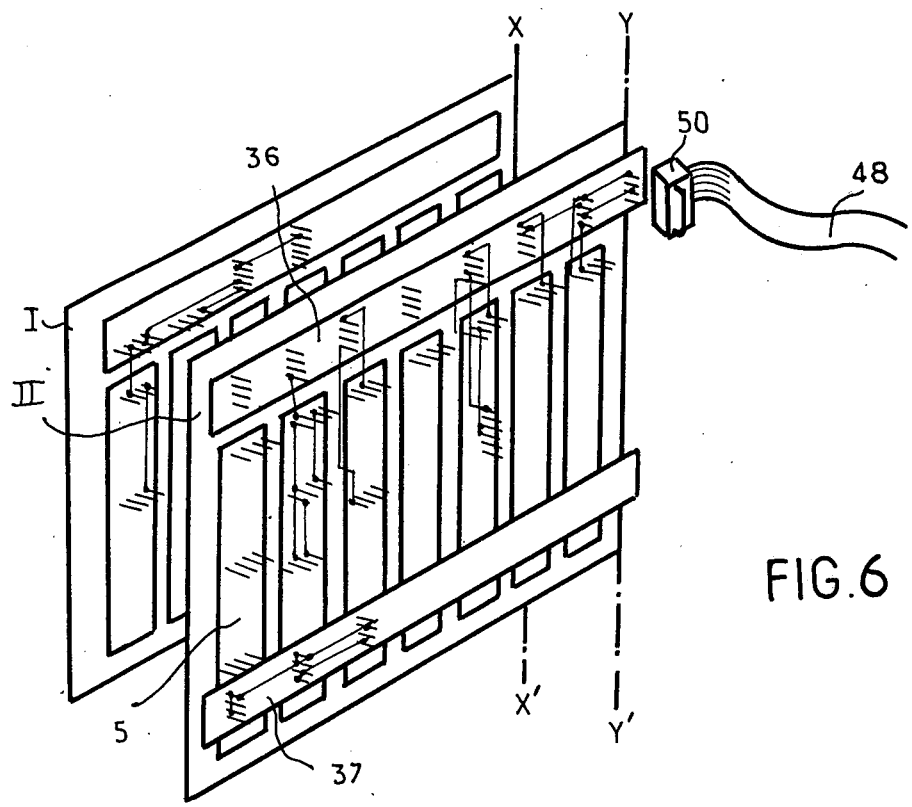
FIGS. 6, 7 and 8 show embodiments which enable groups of modules arranged in different planes to be interconnected.
Figure 7:
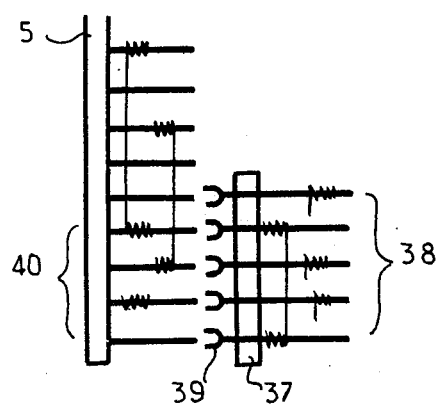

In a modification shown in FIGS. 6 and 7, other strips 37 may be pre-wired and, on the opposite side thereof from the pins 38, may have flexible connecting members 39 comparible to those in the modules, so that the strips can be plugged, in a similar manner, onto a certain number of the pins on the supports 5 which are set aside for this purpose.

Figure 8:
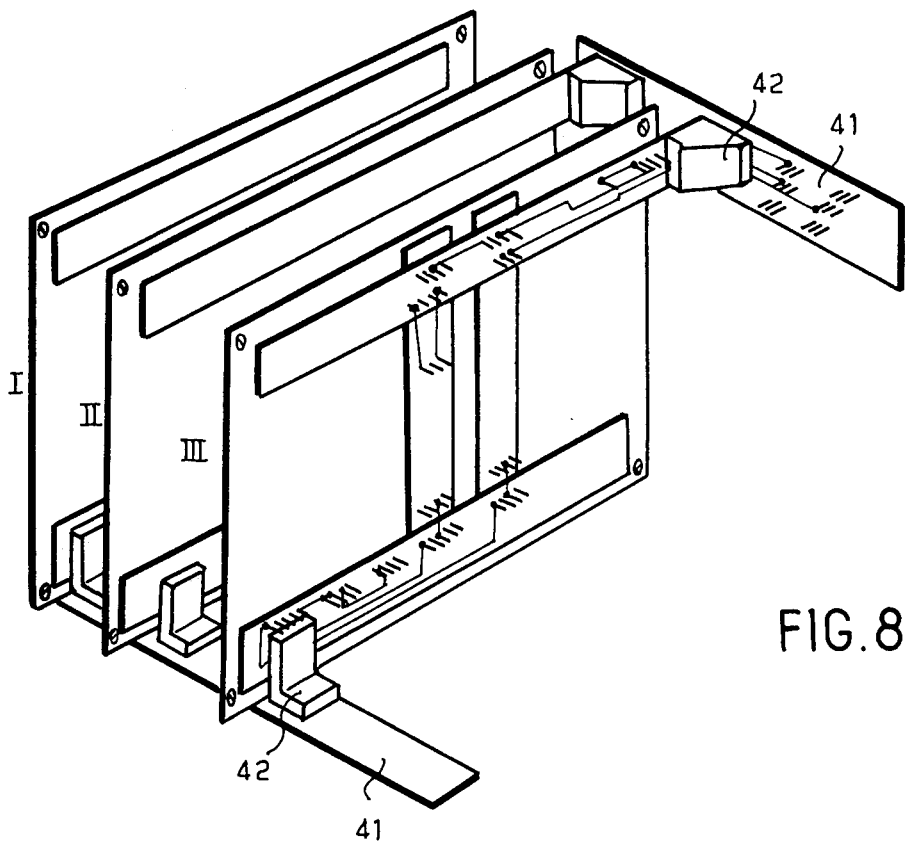

Since the groups of modules are plugged onto insulating supports arranged in the same plane, and since the modules are fairly shallow so as not to put an excessive strain on the devices by which they are secured, it is helpful in more complicated equipment to use a series of parallel partitions I, II, III etc., in the manner shown in FIGS. 6 and 8.

These partitions should be detachable or movable to some degree to enable them to be fitted, and subsequently make it easier to gain access to those partitioned which are positioned to the rear of others. To this end, the partitions may be arranged to pivot about parallel axes such as XX' and YY' in FIG. 6, or alternatively, the partitions (I,II,III,) may be fixed into a cabinet or rack by their edges as shown in FIG. 8. In both cases, the interconnections between the various partitions and the connections to the sources, input variables, and the user apparatus may be made by means of flexible cables or strips 48 as shown in FIG. 6, the ends of which strips are provided with plugs 50 which fit onto the pins on the collector strips 36 or 37 in a similar way to that in which the modules are plugged on.

However, as an alternative, where the partitions do not pivot (see FIG. 8), it is also possible to make provision for connections and interconnections to be made by means of the type of collector strip shown at 41, these strips being arranged in planes perpendicular to the planes of the partitions.

These collector strips 41 may have pins similar to those on collector strips 36, or may have other means by which they may be connected to the collector strips. In all cases the necessity for making the connecting system detachable should be borne in mind, this being achieved by, for example, connectors such as 42, embodiments of which are shown in FIGS. 9a, 9b, 9c. In FIG. 9c, the connector is made up of two members 45 and 46 which are connected together by a flexible insulating strip 47 which bears conductors which are preferably flat.

It is clear that various modifications could be made, particularly with regard to the form of the pins arranged on the supports.

Thus, so as to take advantage of the standard form of the connecting and interconnecting means, and of the fact that access is gained to the wiring from the same direction (arrow F in FIG. 1) as that in which the modules are plugged in, it would be possible, as can be seen in FIGS. 10 and 2, to provide pins having two limbs, one of which, namely the limb 43, would be set aside for wiring, while the other, namely the limb 44, would be intended to take the module. It would also be possible to distribute the ends of the conductors between the limbs 43 and 44 in order, for example, to prevent the necessity for pins of two great a length. This would, however, involve a certain increase in the transverse dimensions of such systems.

We claim:

1. An electrical and electronic automation system comprising in combination:
   i. an insulating support having first and second faces;
   i'. a carrier structure, cooperating groove and rail means on said support and carrier structure for removably attaching said insulating support to said carrier structure;
   ii. a plurality of parallel electrically-conductive pins each having two ends, each pin mounted at one end on the second face of said support and being free only at its other end, said pins being arranged in lines and columns on the support, each pin including a first zone including its free end, and a second zone adjacent to the support and shaped to receive at least one electric lead thereon;
   iii. a plurality of functional module circuits each contained in a modular casing including a bounding wall having therein a plurality of openings arranged in lines and columns and corresponding in position to said pins;
   iv. a plurality of resilient contacts mount in said casing spaced from said bounding wall and arranged in lines and columns and corresponding in number and position to the openings in said wall, said contacts being directly connected to electrical circuits of the modules and receiving the free ends of said pins in said first zone thereof;
   v. limiting means serving to restrict the extent to which the pins may enter the modular casing, and
   vi. electrical leads secured on said pins at said second zone for connecting selected pins to each other to connect said module circuits to each other and to other external circuits.

2. An electrical and electronic automation system, as claimed in claim 1, wherein each modular casing comprises a second bounding wall opposed to said first-mentioned bounding wall, the spacing of said first and second bounding walls of all of the modular casings being substantially the same and the modular casings being arranged side by side.

3. An electrical and electronic automation system, as claimed in claim 1, wherein said limiting means comprise a member arranged to become positioned between said support and said bounding wall when said resilient contacts are engaged on said pins.

4. An electrical and electronic automation system, as claimed in claim 1, wherein said limiting means comprise an internal wall in said modular casing positioned to be abutted by the free end of the pins engaged through the openings in the bounding wall of the modular casing.

5. An electrical and electronic automation system, as claimed in claim 1, comprising an insulating wall secured on said support, said wall having openings through which said pins pass such that said insulating wall is positioned between the first and second zone of each pin.

6. An electrical and electronic automation system comprising, in combination:
   i. an insulating support having first and second faces;
   i'. a carrier structure and means for removably attaching the first face of said insulating support to said carrier structure;
   ii. a plurality of parallel electrically conductive pins each having two ends, each pin being mounted at one end on the second face of said support and being free only at its other end, said pins being arranged in lines and columns on the support, each pin including a first zone including its free end, and a second zone adjacent to the support and shaped to receive electric leads thereon;
   iii. a plurality of functional module circuits each contained in a modular casing including a bounding wall having therein a plurality of openings arranged in lines and columns and corresponding in position to said pins;
   iv. a plurality of resilient contacts mounted in said casing spaced from said bounding wall and arranged in lines and columns and corresponding in number and position to the openings in said wall, said contacts being directly connected to electrical circuits of the modules and receiving the free ends of said pins in said first zone thereof;
   v. limiting means serving to restrict the extent to which the pins may enter the modular casing, and
   vi. electrical leads secured on said pins at said second zone for connecting said module circuits to each other and to other external circuits, an insulating wall secured on said support, said wall having openings through which said pins pass such that said insulating wall is positioned between the first and second zone of each pin, locking members on said modular casings arranged to engage with said insulating wall for retaining said modules releasably on said support.

7. An electrical and electronic automation system, as claimed in claim 1, comprising a plurality of terminals mounted on said support and directly coupled to external electrical conductors, at least some of said pins being electrically connected to respective terminals.

8. An electrical and electronic automation system comprising, in combination:
   i. an insulating support having first and second faces;
   i'. a carrier structure and means for removably attaching the first face of said insulating support to said carrier structure;
   ii. a plurality of parallel electrically-conductive pins each having two ends, each pin being mounted at one end on the second face of said support and being free only at its other end, said pins being arranged in lines and columns on the support, each pin including a first zone including its free end, and a second zone adjacent to the support and shaped to receive electric leads thereon;
   iii. a plurality of functional module circuits each contained in a modular casing including a bounding wall having therein a plurality of openings arranged in lines and columns and corresponding in position to said pins;
   iv. a plurality of resilient contacts mounted in said casing spaced from said bounding wall and arranged in lines and columns and corresponding in number and position to the openings in said wall, said contacts being directly connected to electrical circuits of modules and receiving the free ends of said pins in said first zone thereof;
   v. limiting means serving to restrict the extent to which the pins may enter the modular casing, and
   vi. electrical leads secured on said pins at said second zone for connecting said module circuits to each other and to other external circuits, a carrier rail secured on said carrier structure, said support comprising attachment means being slidably engaged on said carrier rail.

* * * * *